US008729968B2

(12) United States Patent
Hsieh et al.

(10) Patent No.: US 8,729,968 B2
(45) Date of Patent: May 20, 2014

(54) BUILT-IN SELF-TEST CIRCUIT FOR VOLTAGE CONTROLLED OSCILLATORS

(75) Inventors: Hsieh-Hung Hsieh, Taipei (TW); Ming Hsien Tsai, New Taipei (TW); Tzu-Jin Yeh, Hsin-Chu (TW); Chewn-Pu Jou, Hsin-Chu (TW); Fu-Lung Hsueh, Cranbury, NJ (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 228 days.

(21) Appl. No.: 13/103,571

(22) Filed: May 9, 2011

(65) Prior Publication Data

US 2012/0286836 A1 Nov. 15, 2012

(51) Int. Cl.
*H03L 5/00* (2006.01)

(52) U.S. Cl.
USPC ............................................ 331/109; 331/44

(58) Field of Classification Search
USPC ........................................... 331/109, 44, 160
See application file for complete search history.

(56) References Cited

U.S. PATENT DOCUMENTS 7,126,359 B2 10/2006 Huang et al.
7,271,674 B1 * 9/2007 Butenhoff et al. ............ 331/183
2005/0138499 A1 6/2005 Pileggi et al.
2006/0259836 A1 11/2006 Liu
2008/0266011 A1 * 10/2008 Kuosmanen .................. 331/175
2008/0278247 A1 * 11/2008 Wang et al. ..................... 331/44

OTHER PUBLICATIONS

Ratni, et al., "RF Power Detector Using a Silicon MOSFET," IEEE MTT-S Digest, 1998, pp. 1139-1142.

* cited by examiner

*Primary Examiner* — Joseph Chang
(74) *Attorney, Agent, or Firm* — Slater and Matsil, L.L.P.

(57) ABSTRACT

A built-in self-test circuit for testing a voltage controlled oscillator comprises a voltage controlled oscillator, a buffer having an input coupled to an output of the voltage controlled oscillator and a radio frequency peak detector coupled to the output of the buffer. The radio frequency peak detector is configured to receive an ac signal from the voltage controlled oscillator and generate a dc value proportional to the ac signal at an output of the radio frequency peak detector. Furthermore, the output of the radio frequency peak detector generates a dc value proportional to an amplitude of the ac signal from the voltage controlled oscillator when the voltage controlled oscillator functions correctly. On the other hand, the output of the radio frequency peak detector is at zero volts when the voltage controlled oscillator fails to generate an ac signal.

20 Claims, 7 Drawing Sheets

VCO
Buffer
RF Peak Detector
DC Value
102
104
106

BUILT-IN SELF-TEST CIRCUIT FOR VOLTAGE CONTROLLED OSCILLATORS

BACKGROUND

In radio frequency circuits, such as a receiver or transceiver, a voltage controlled oscillator (VCO) is used as a frequency synthesizer to down-convert or up-convert a radio frequency signal. A VCO may comprise an oscillator designed to be controlled in frequency by a received voltage generated by a VCO control system formed by a frequency divider, a frequency and phase detector, a charge pump and a low pass filter. In the VCO control system, the output of the frequency divider is compared with a reference signal at the frequency and phase detector. The output of the frequency and phase detector is coupled to the low pass filter and further coupled to the oscillator. As a result, the oscillator generates a desired signal in response to the voltage from the low pass filter.

During the process of fabricating semiconductor chips, a plurality of VCO circuits may be built on a wafer. In order to detect defective voltage controlled oscillators of a wafer, various testing circuits are employed to test voltage controlled oscillators during different phases of fabricating semiconductor devices. There are two major types: semiconductor testing performed at wafer level and semiconductor testing performed at packaging level. An advantageous feature of wafer level testing is that wafer level product testing helps to reduce the cost of package and improve the yield.

Wafer level testing can be done by either using a probe card or built-in self-test circuits. A probe card may comprise a variety of probes. Each of the variety of probes may be coupled to a testing pad on a wafer to be tested. The probe card generates a testing signal and reads the testing results from the probes coupled to the testing pads on the wafer. If one circuit block on the wafer does not work or its result is out of the limit to which the circuit block is specified, the probe card can find the failure through the result from the probe coupled to the defective circuit block. By employing the probe card, defective circuit blocks can be found so that they are screened out before the wafer is sent to the next stage of a semiconductor fabrication process. As a result, the cost for packaging defective chips will be saved.

Built-in self-test circuits may be placed at regions wherein scribe lines are drawn. While conventional built-in self-test circuits may only test open-circuit, short-circuit and dc characteristics of an active device, conventional built-in self-test circuits may be not sufficient for evaluating a VCO because the ac characteristics of a VCO is a key factor to decide whether the radio frequency performance of the VCO is within the limit to which the VCO is specified. As a result, despite passing wafer level testing of open-circuit, short-circuit and dc characteristics, some VCO circuits may still fail to pass the final packaged chip test.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a single transistor based peak detector converting the amplitude of an ac signal from a cross-coupled voltage controlled oscillator into a dc value. The invention may also be applied, however, to converting an ac signal's amplitude into a dc value by means of various peak detector topologies.

Figure 1:
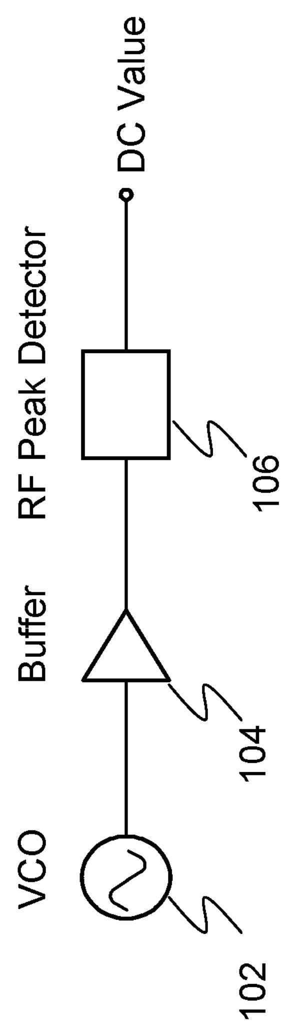
FIG. 1 illustrates a block diagram of a built-in self-test circuit for testing a voltage controlled oscillator in accordance with an embodiment.

Referring initially to FIG. 1, a block diagram of a built-in self-test circuit for testing a voltage controlled oscillator (VCO) is illustrated in accordance with an embodiment. In a wafer, there may be a plurality of VCO circuits such as VCO 102 illustrated in FIG. 1. In order to test the ac characteristics of the VCO 102, a radio frequency (RF) peak detector 106 is built, preferably in the same wafer, and coupled to the output of the VCO 102 via a buffer 104. The RF peak detector 106 is configured such that: when the VCO 102 generates an ac signal, the RF peak detector 106 detects the amplitude of the ac signal and generates a dc output proportional to the amplitude of the ac signal. The detailed operation of the RF peak detector 106 will be described below with respect to FIG. 2. On the other hand, when the VCO 102 fails to generate an ac signal, the output of the RF peak detector 106 is at zero volts. An advantageous feature of having an on-chip self-test RF peak detector is that the failed VCO can be identified before packaging so as to reduce unnecessary time and cost in the subsequent steps of a semiconductor fabrication process.

Figure 2:
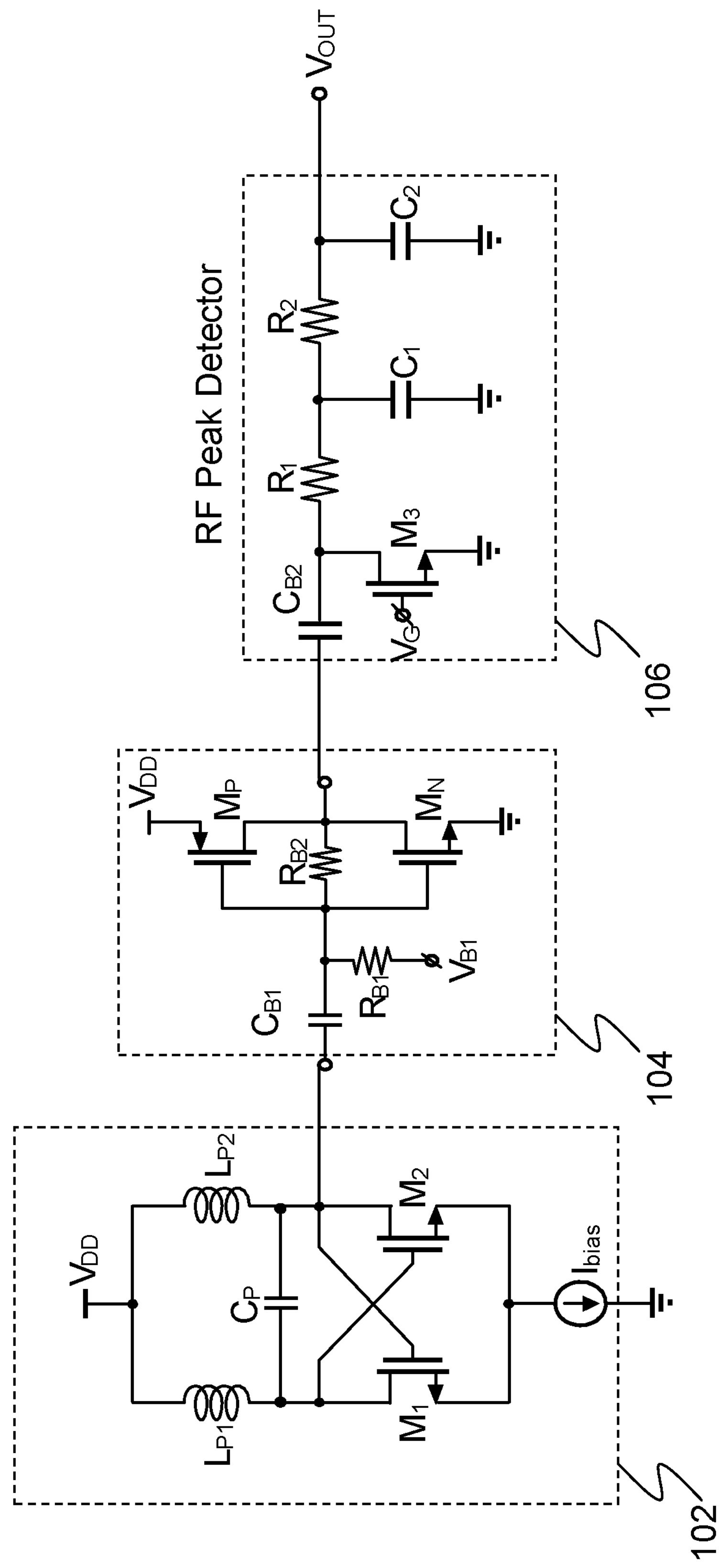
FIG. 2 illustrates in detail a schematic diagram of the built-in self-test circuit shown in FIG. 1.

FIG. 2 illustrates in detail a schematic diagram of the built-in self test circuit shown in FIG. 1. In accordance with an embodiment, a cross-coupled VCO is used to illustrate the inventive aspects of the various embodiments. The cross-coupled VCO 102 comprises a first inductor $L_{P1}$, a second inductor $L_{P2}$, a capacitor $C_P$, a pair of n-channel metal oxide semiconductor (NMOS) transistors M1 and M2 and a bias current source $I_{bias}$. Both the first inductor $L_{P1}$ and the second inductor $L_{P2}$ are coupled to a voltage potential VDD at one terminal and coupled to the capacitor $C_P$ at the other terminal. The L-C tank formed by the first inductor $L_{P1}$, the second inductor $L_{P2}$ and the capacitor $C_P$ are further coupled to the pair of NMOS transistors M1 and M2. It should be noted that the inductors $L_{P1}$, $L_{P2}$ and the capacitor $C_P$ may be derived from inductive effects of a square area from a wafer such as a square spiral inductor and capacitive effects of a NMOS transistor respectively.

The NMOS transistor M1 and the NMOS transistor M2 are cross-coupled to opposite terminals. More particularly, the gate of the NMOS transistor M1 is coupled to the drain of the NMOS transistor M2 and the gate of the NMOS transistor M2 is coupled to the drain of the NMOS transistor M1. As shown in FIG. 2, the drains of both NMOS transistors M1 and M2 are further coupled to the L-C tank formed by inductors $L_{P1}$, $L_{P2}$ and capacitor $C_P$. The sources of both NMOS transistor M1 and M2 are connected together and coupled to ground via the bias current source $I_{bias}$. As known in the art, the cross-coupled VCO 102 is capable of having a wider tuning range by fine-tuning the value of the capacitor $C_P$. The operation principle of a cross-coupled VCO is well-known in the art, and thus is not discussed herein.

The buffer 104 comprises a p-channel metal oxide semiconductor (PMOS) transistor $M_P$ and an NMOS transistor $M_N$ connected in series. More particularly, the source of the PMOS transistor $M_P$ is connected to the voltage potential VDD and the drain of the PMOS transistor $M_P$ is coupled to the drain of the NMOS transistor $M_N$. The gates of the PMOS transistor $M_P$ and the NMOS transistor $M_N$ are connected together and further coupled to the output of the cross-coupled VCO 102 via a first blocking capacitor $C_{B1}$. The buffer further comprises two bias resistors $R_{B1}$ and $R_{B2}$. The first bias resistor $R_{B1}$ is connected from a bias voltage potential $V_{B1}$ to the gates of $M_P$ and $M_N$. The second bias resistor $R_{B2}$ is connected between the gates and drains of both transistors $M_P$ and $M_N$. The buffer 104 is used to isolate the cross-coupled VCO 102 and the RF peak detector 106 so as to prevent the RF peak detector 106 from interfering with the operation of the cross-coupled VCO 102. The operation principle of the buffer shown in FIG. 2 is well-known in the art, and thus is not discussed herein. However, it should be noted that the buffer shows in FIG. 2 can be replaced by any circuits capable of isolating the VCO 102 from the RF peak detector 106. For example, the isolation between the VCO 102 and the RF peak detector 106 can be implemented by adding a differential pair between the VCO 102 and the RF peak detector 106.

The RF peak detector 106 comprises an NMOS transistor M3 operating at a weak inversion region, a second block capacitor $C_{B2}$, a first filter and a second filter. It should be noted while FIG. 2 illustrates a RF peak detector employing an NMOS transistor operating at a weak inversion region, the RF peak detector shown in FIG. 2 is merely an example, which should not unduly limit the scope of the claims. One of ordinary skill in the art would recognize many variations, alternatives, and modifications. For example, the NMOS transistor may be replaced by a PMOS transistor operating at a weak inversion region. Furthermore, the RF peak detector 106 can be replaced by any circuits capable of converting an amplitude of an ac signal into a dc value. It should further be noted that while FIG. 2 illustrates two filters connected in cascade, a single filter may fulfill the function of eliminating high frequency unwanted signals and generating a dc value at the output of the RF peak detector 106.

While there may be many ways of implementing a RF peak detector, when the RF peak detector is implemented on a wafer, there is a need for simplification as well as performance. As a result, a simple peak detector topology is preferred. The RF peak detector 106 is formed by a single NMOS transistor, and thus is a preferred embodiment for implementing the built-in self-test circuit for a VCO. The NMOS transistor M3 has a gate coupled to a fixed voltage $V_G$, which is small enough so that the NMOS transistor M3 is biased to operate in a weak inversion region. As known in the art, the drain current of a NMOS transistor operating in a weak inversion region can be expressed by an exponential function as follows:

$$I_D = \frac{W}{L} I_{D0} \cdot e^{qV_{GS}/nkT} \cdot (1 - e^{-qV_{DS}/kT})$$

Where W, L, $I_{D0}$, q, nkT are constants for an NMOS transistor. Because the gate-to-source voltage of the NMOS transistor is fixed, the equation above can be further simplified into the following equation:

$$I_D = K_1 \cdot (1 - e^{K_2 \cdot V_{DS}})$$

Where K1 and K2 are constants. In accordance with the Taylor series approximation, the drain current can be simplified by replacing the exponential function with the first three terms of the Taylor series. As a consequence, the drain current can be expressed as:

$$I_D = K_1 \cdot \left(K_2 \cdot V_{DS} + \frac{1}{2} \cdot K_2^2 \cdot V_{DS}^2\right)$$

Where $V_{DS}$ is generated from the output of the VCO 102. Use a cosine function to replace $V_{DS}$. The equation above can be expressed as:

$$I_D = K_1 \cdot K_2 \cdot \cos(\omega X) + \frac{1}{4} \cdot K_1 \cdot K_2^2 \cdot (1 + \cos(2\omega X))$$

From the equation above, the drain current comprises a dc component as well as an ac component proportional to the amplitude of the input signal generated from the VCO 102. As a result, the NMOS transistor 104 operating at a weak inversion region can convert an ac input signal into a dc component and an ac component proportional to the signal generated by the VCO 102. It should be noted while FIG. 1 illustrates an NMOS transistor operating at a weak inversion region, the RF peak detector can also be implemented by a PMOS transistor operating at a weak inversion region. As known in the art, the operation of a PMOS transistor operating at a weak inversion region will not be discussed herein to avoid repetition.

FIG. 2 further illustrates a first filter formed by R1 and C1 and a second filter formed by R2 and C2. Both filters have a cut-off frequency much lower than the frequency of the ac signal generated from the VCO 102. As a result, the high frequency ac components at the output of the NMOS transistor M3 are eliminated and the dc component can pass through both filters and reach the output of the RF peak detector 106. An advantageous feature of having an NMOS transistor operating at a weak inversion region is that a dc component proportional to the amplitude of the output of the VCO can be forwarded to the output of the RF peak detector 106 and unwanted ac components are eliminated by the low pass filters shown in FIG. 2.

Figure 3A:
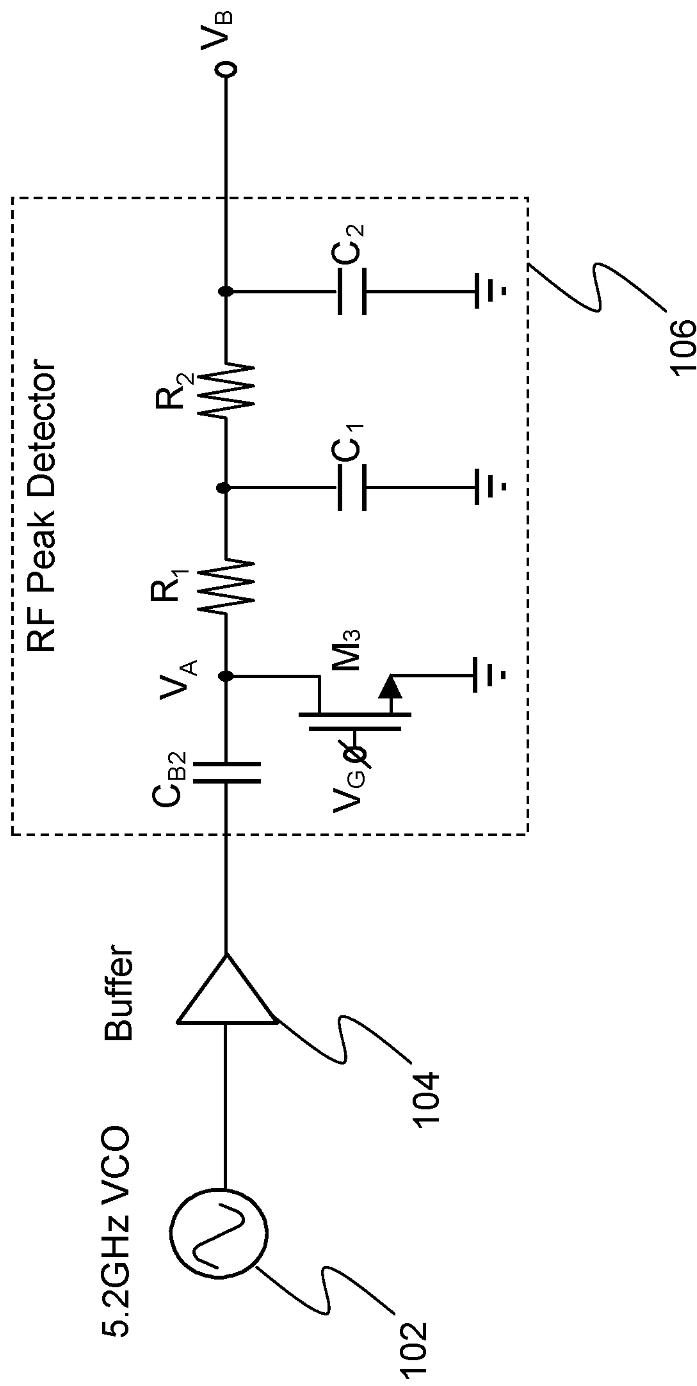
FIGS. 3A-3C illustrate a built-in self-test circuit for testing a VCO generating a 5.2 GHz signal.
Figure 3C:
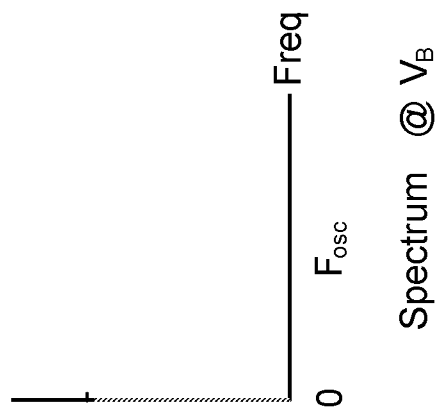
Figure 3B:
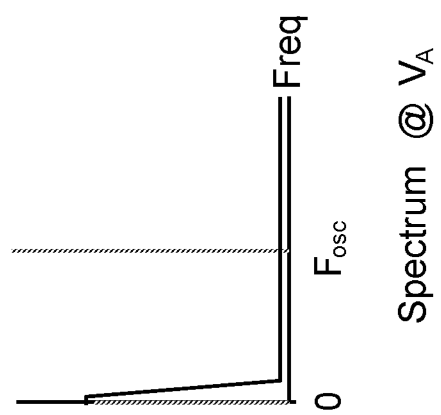

FIG. 3A shows a built-in self-test circuit for testing a VCO generating a 5.2 GHz signal. When the VCO 102 functions correctly and generates a 5.2 GHz signal, as shown in FIG. 3B, the spectrum at $V_A$ of the RF peak detector 106 includes a dc component and an ac component at 5.2 GHz. Furthermore, the first filter and second filter eliminate the high frequency ac component. As shown in FIG. 3C, the spectrum at $V_B$ includes only a dc component proportional to the amplitude of the 5.2 GHz signal generated by the VCO 102.

Figure 4A:
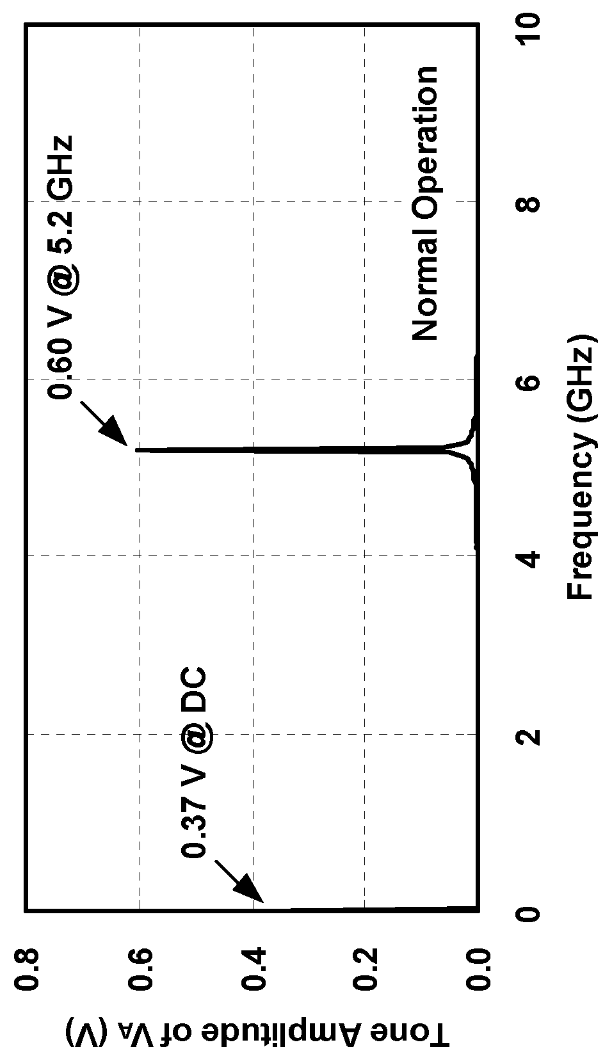
FIGS. 4A-4C illustrate in detail a simulation result of the built-in self-test circuit shown in FIG. 3A.
Figure 4B:
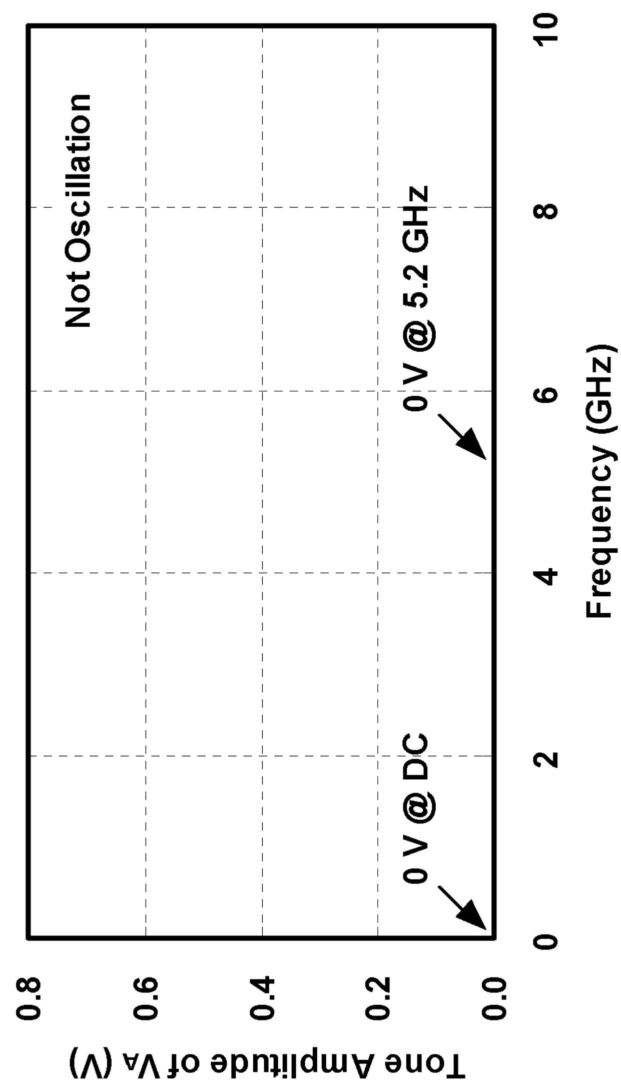
Figure 4C:
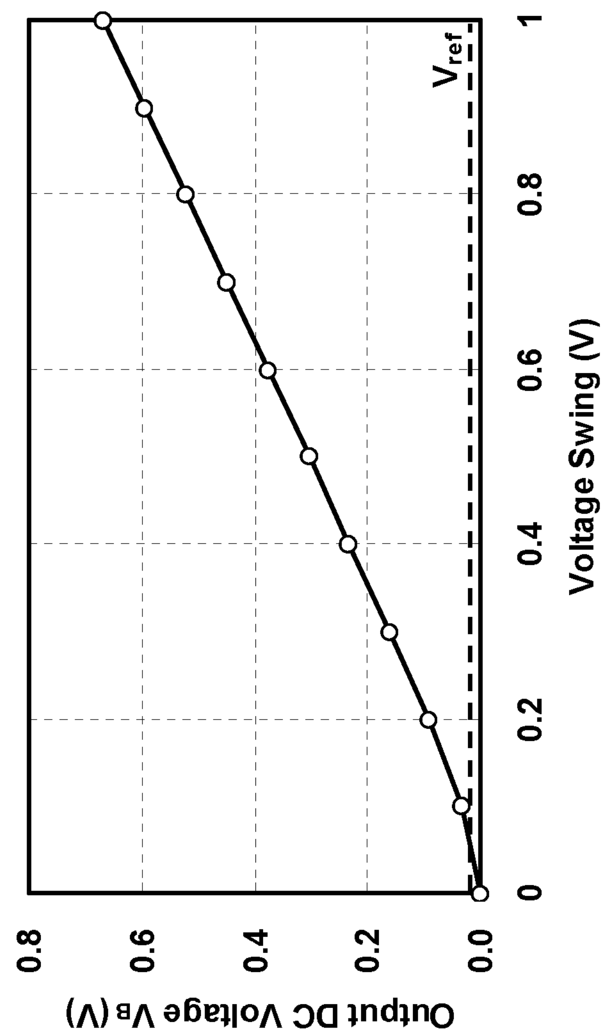

FIGS. 4A-4C illustrate in detail a simulation result of the built-in self-test circuit shown in FIG. 3A. In accordance with an embodiment, when the VCO 102 is in a normal operation mode generating a 5.2 GHz ac signal, the simulation result shows at $V_A$ the dc component has a voltage potential of 0.37V and the ac component at 5.2 GHz has a amplitude of 0.60V. In contrast, when the VCO 102 fails to generate an ac signal at 5.2 GHz, FIG. 4B shows both the dc component and the ac component at 5.2 GHz are at zero volts. FIG. 4C further gives a relationship curve between the amplitude of the ac signal generated by the VCO 102 and the dc component's value at the output of the RF peak detector 106. For example, when the VCO 102 generates an ac signal having an amplitude of 0.6V, the corresponding dc value at the output of the RF peak detector 106 is 0.4V. The curve in FIG. 4C shows another advantageous feature of the RF peak detector is that the amplitude of an ac signal generated by the VCO 102 can be back-calculated based upon the dc value at the output of the RF peak detector 106.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit comprising:

a radio frequency peak detector configured to receive an ac signal from a voltage controlled oscillator and generate a dc value proportional to the ac signal at an output of the radio frequency peak detector, wherein the ac signal is of an amplitude greater than the dc value; and a buffer placed between the radio frequency peak detector and the voltage controlled oscillator.

2. The circuit of claim 1, wherein the radio frequency peak detector comprises:

an n-type metal oxide semiconductor (NMOS) transistor operating in a weak inversion region; and a first filter coupled between a drain terminal of the NMOS transistor and the output of the radio frequency peak detector.

3. The circuit of claim 2, wherein the first filter is configured such that a cut-off frequency of the first filter is less than a minimum frequency generated by the voltage controlled oscillator.

4. The circuit of claim 2, wherein a gate of the NMOS transistor is coupled to a fixed voltage potential.

5. The circuit of claim 2, further comprising: a second filter connected in cascade with the first filter; and a block capacitor placed between an input of the radio frequency peak detector and the drain terminal of the NMOS transistor.

6. The circuit of claim 1, wherein the buffer comprises:

a p-type metal oxide semiconductor (PMOS) transistor and an NMOS transistor connected in series; and a blocking capacitor placed between an input of the buffer and a gate junction point coupled to a gate of the PMOS transistor and a gate of the NMOS transistor.

7. The circuit of claim 1, wherein the voltage controlled oscillator is a cross-coupled oscillator.

8. The circuit of claim 1, wherein the radio frequency peak detector is formed on a same wafer as the voltage controlled oscillator.

9. A system comprising: a voltage controlled oscillator;

a buffer having an input coupled to an output of the voltage controlled oscillator; and a radio frequency peak detector configured to receive an ac signal from the voltage controlled oscillator and generate a dc value proportional to the ac signal at an output of the radio frequency peak detector, wherein the ac signal is of an amplitude greater than the dc value.

10. The system of claim 9, wherein the voltage controlled oscillator is a cross-coupled oscillator comprising:

an L-C tank formed by a first inductor, a second inductor and a capacitor;

a cross-coupled transistor pair wherein a first transistor of the pair has a gate coupled to a drain of a second transistor of the pair and the second transistor has a gate coupled to a drain of the first transistor; and a bias current source coupled between the cross-coupled transistor pair and ground.

11. The system of claim 9, where the buffer is configured to isolate the voltage controlled oscillator from the radio frequency peak detector.

12. The system of claim 9, wherein the radio frequency peak detector comprises:

an n-type metal oxide semiconductor (NMOS) transistor operating in a weak inversion region;

a first filter connected to a drain terminal of the NMOS transistor; and a second filter coupled between the first filter and the output of the radio frequency peak detector.

13. The system of claim 12, wherein the first filter and the second filter have cut-off frequencies less than a minimum frequency generated by the voltage controlled oscillator.

14. The system of claim 9, wherein the radio frequency peak detector comprises a blocking capacitor placed between an output of the buffer and an input of the radio frequency peak detector.

15. The system of claim 9, wherein the voltage controlled oscillator, the buffer and the radio frequency peak detector are formed on a same wafer.

16. A method comprising:

receiving an ac signal from a voltage controlled oscillator via a buffer;

detecting a peak value of the ac signal; and converting the peak value into a dc value at an output of a radio frequency peak detector, wherein the ac signal is of an amplitude greater than the dc value.

17. The method of claim 16, further comprising:

connecting a gate of an n-type metal oxide semiconductor (NMOS) transistor to a fixed voltage;

generating a dc component and an ac component at a drain of the NMOS transistor;

eliminating the ac component by employing a plurality of filters coupled between the drain of the NMOS transistor and the output of the radio frequency peak detector; and generating a dc value proportional to an amplitude of the ac signal from the voltage controlled oscillator.

18. The method of claim 16, further comprising placing the buffer between the voltage controlled oscillator and the radio frequency peak detector.

19. The method of claim 16, wherein the radio frequency peak detector is configure such that:

the output of the radio frequency peak detector generates a dc value proportional to an amplitude of the ac signal from the voltage controlled oscillator when the voltage controlled oscillator functions correctly; and the output of the radio frequency peak detector is at zero volts when the voltage controlled oscillator fails to generate an ac signal.

20. The method of claim 16, further comprising forming the voltage controlled oscillator, the buffer and the radio frequency peak detector on a same wafer.

* * * * *